(12) United States Patent  
Bolanowski et al.

(10) Patent No.: US 9,007,783 B2  
(45) Date of Patent: Apr. 14, 2015

(54) MEMORY DEVICE AND RECEPTACLE FOR ELECTRONIC DEVICES

(75) Inventors: Wladyslaw Bolanowski, Bara (SE); Peter Aberg, Vinslov (SE)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 709 days.

(21) Appl. No.: 13/176,889

(22) Filed: Jul. 6, 2011

(65) Prior Publication Data

US 2012/0307458 A1    Dec. 6, 2012

Related U.S. Application Data

(60) Provisional application No. 61/491,455, filed on May 31, 2011.

(51) Int. Cl.
  *H05K 1/14* (2006.01)
  *H05K 1/11* (2006.01)
  *H05K 7/10* (2006.01)

(52) U.S. Cl.
  CPC .................... *H05K 7/1069* (2013.01)

(58) Field of Classification Search
  USPC ................ 361/785, 728; 439/71, 72
  See application file for complete search history.

(56) References Cited

U.S. PATENT DOCUMENTS

| | | | | |
|---|---|---|---|---|
| 4,393,581 A | * | 7/1983 | Cherian | 29/827 |
| 4,737,782 A | * | 4/1988 | Fukuma et al. | 345/51 |
| 4,747,017 A | * | 5/1988 | Koors et al. | 361/737 |
| 4,806,106 A | * | 2/1989 | Mebane et al. | 439/77 |
| 5,069,626 A | * | 12/1991 | Patterson et al. | 439/55 |
| 5,071,363 A | * | 12/1991 | Reylek et al. | 439/291 |
| 5,813,869 A | * | 9/1998 | Matsumura | 439/72 |
| 5,921,787 A | * | 7/1999 | Pope et al. | 439/74 |
| 5,931,689 A | * | 8/1999 | Patel | 439/346 |
| 6,190,209 B1 | * | 2/2001 | Hulsmann et al. | 439/660 |
| 6,250,935 B1 | * | 6/2001 | Mochizuki et al. | 439/74 |
| 6,339,191 B1 | * | 1/2002 | Crane et al. | 174/551 |
| 6,368,121 B1 | * | 4/2002 | Ueno et al. | 439/108 |
| 6,846,202 B1 | * | 1/2005 | Schmidt et al. | 439/660 |
| 6,984,137 B2 | * | 1/2006 | Akasaka et al. | 439/108 |
| 6,994,578 B1 | * | 2/2006 | Chen | 439/291 |
| 7,013,538 B2 | * | 3/2006 | Browne et al. | 24/603 |
| 7,344,387 B2 | * | 3/2008 | Shiroyama | 439/74 |
| 7,556,504 B2 | * | 7/2009 | Ryu | 439/70 |
| 7,632,132 B2 | * | 12/2009 | Nishio et al. | 439/357 |
| 2009/0181561 A1 | * | 7/2009 | Kusaki et al. | 439/72 |

* cited by examiner

*Primary Examiner* — David M Sinclair  
*Assistant Examiner* — Theron Milliser  
(74) *Attorney, Agent, or Firm* — Renner, Otto, Boisselle & Sklar, LLP (57) ABSTRACT

A random access memory (RAM) memory module has a compact form factor and is removable from a corresponding socket assembly to allow easy replacement of the memory module or reconfiguration of the memory module during development of an electronic device that includes the memory module.

8 Claims, 6 Drawing Sheets

MEMORY DEVICE AND RECEPTACLE FOR ELECTRONIC DEVICES

RELATED APPLICATION DATA

This application claims the benefit of U.S. Provisional Patent Application No. 61/491,455, filed May 31, 2011 and titled "Memory Device and Receptacle for Electronic Devices," the disclosure of which is incorporated herein by reference in its entirety.

TECHNICAL FIELD OF THE INVENTION

The technology of the present disclosure relates generally to random access memory (RAM) for electronic devices and, more particularly, to an improved memory form factor and receptacle for the memory device.

BACKGROUND

Many electronic devices include RAM modules. Exemplary devices that include RAM modules include mobile telephones (including smart phones), tablet computers, laptop computers, desktop computers, and so on. Various RAM form factors have been used, such as dual in-line memory modules (DIMMs). A DIMM form factor includes a printed circuit board (PCB, also referred to as printed wire board or PWB) with integrated circuit packages housing the memory mounted to the PCB. Rows of electrical connectors are located on the major surfaces of the PCB and along an edge of the PCB. The edge of the PCB is inserted into a compatible socket to make electrical connection between the DIMM and other electronics, such as a processor.

Due to their size, DIMMs are not very convenient for very small devices such as smart phones and tablet computers. For these devices, there is a preference to use a low power double data rate (LPDDR) form factor. Commonly used is the LPDDR2 form factor in which about 100 pins are needed for one channel operation and about 200 hundred pins are needed for two channel operation. In their present form factor, LPDDR packages have pads on a bottom surface of the package that are soldered to cooperating pads on a PCB or on a processor chip. As a result, memory in devices using LPDDR is not readily replaceable or expandable.

SUMMARY

According to one aspect of the disclosure, a memory module includes a module body having a length, a width, and a thickness; a random access memory (RAM) memory core retained by the module body and having a length parallel to the length of the module body, a width parallel to the width of the module body, and a thickness; and for each of one or more sides of the module body: a first plurality of contacts disposed at a first wall that is parallel to the thickness of the module body; and a second plurality of contacts disposed at a second wall that is parallel to the thickness of the module body, electrical connection between the memory core and circuitry external to the memory module made through the first and second plurality of contacts.

According to one embodiment of the memory module, the memory module has an outer perimeter defined by the first wall and the second wall.

According to one embodiment of the memory module, for the one or more sides of the module body, the first wall is offset from the second wall in a corresponding one of the length direction or the width direction of the module body.

According to one embodiment of the memory module, the memory module is part of a memory assembly that also includes a socket assembly including: for the one or more sides of the module body, a first wall corresponding to the first wall of the module body and a second wall corresponding to the second wall of the module body; and connector pins disposed along the first and second walls of the socket assembly, the connector pins in alignment and electrical contact with the contacts of the memory module.

According to one embodiment of the memory assembly, the connector pins of the socket assembly are resilient and deformed by the memory module, counterforce on the memory module by the connector pins at least one of increasing electrical contact between the contacts of the memory module and the connector pins of the socket assembly or retaining the memory module in engagement with the socket assembly.

According to one embodiment of the memory module, the module body includes a key mechanism configured to align the memory module with a corresponding socket assembly in a single orientation.

According to one embodiment of the memory module, the memory core is disposed on an upper surface of the module body.

According to one embodiment of the memory module, the memory core is embedded within the module body.

According to one embodiment of the memory module, the first and second walls are sidewalls of a channel in the module body.

According to one embodiment of the memory module, the memory module is part of a memory assembly that also includes a socket assembly including a connector portion shaped to fit in the channel and connector pins disposed adjacent the connector portion, the connector pins in alignment and electrical contact with the contacts of the memory module.

According to one embodiment of the memory assembly, the connector pins of the socket assembly are resilient and deformed by the memory module, counterforce on the memory module by the connector pins at least one of increasing electrical contact between the contacts of the memory module and the connector pins of the socket assembly or retaining the memory module in engagement with the socket assembly.

According to one embodiment of the memory module, the memory module is part of a memory assembly that also includes a socket assembly including a connector portion shaped to receive the module body and connector pins disposed adjacent the connector portion, the connector pins in alignment and electrical contact with the contacts of the memory module.

According to another aspect of the disclosure, a memory module includes a module body; a random access memory (RAM) memory core retained by the module body; a channel in the module body having a first wall and an opposed second wall; and a plurality of contacts at the first wall and a plurality of contacts at the second wall, electrical connection between the memory core and circuitry external to the memory module made through the first and second plurality of contacts.

According to one embodiment of the memory module, the walls are disposed in respective planes that are perpendicular to a plane in which a length and a width of the memory core are disposed.

According to one embodiment of the memory module, the module body includes a key mechanism configured to align the memory module with a corresponding socket assembly in a single orientation.

According to one embodiment of the memory module, the memory core is disposed on an upper surface of the module body.

According to one embodiment of the memory module, the memory core is embedded within the module body.

According to one embodiment of the memory module, the memory module is part of a memory assembly that also includes a socket assembly including a connector portion shaped to fit in the channel and connector pins disposed adjacent the connector portion, the connector pins in alignment and electrical contact with the contacts of the memory module.

According to one embodiment of the memory assembly, the connector pins of the socket assembly are resilient and deformed by the memory module, counterforce on the memory module by the connector pins at least one of increasing electrical contact between the contacts of the memory module and the connector pins of the socket assembly or retaining the memory module in engagement with the socket assembly.

According to another aspect of the disclosure, a memory module includes a substrate having opposed first and second major surfaces and perimeter side edges; a random access memory (RAM) memory core retained by the substrate on the first major surface; contact pads on the second major surface opposite the memory core; and edge contacts disposed on the first and second major surfaces along a first of the edges, electrical connection between the memory core and circuitry external to the memory module made through the contact pads and edge contacts.

According to one embodiment of the memory module, the memory module claim further includes additional edge contacts disposed on the first and second major surfaces along a second of the edges.

According to one embodiment of the memory module, the second of the edges is opposite the first of the edges.

According to one embodiment of the memory module, the substrate is a printed circuit board.

According to one embodiment of the memory module, the memory module is part of a memory assembly that also includes a socket assembly including: a slot connector that receives the first edge of the substrate and having electrical contacts in alignment and electrical contact with the edge contacts of the memory module; and contacts that are in alignment and electrical contact with the contact pads of the memory module.

According to one embodiment of the memory assembly, the contacts of the socket assembly that electrically contact the contact pads of the memory module are spring contacts.

According to one embodiment of the memory assembly, the slot connector is inflexibly mounted to a printed circuit board.

According to one embodiment of the memory assembly, the socket assembly further includes a second slot connector that receives a second edge of the substrate and having electrical contacts in alignment and electrical contact with additional edge contacts disposed on the first and second major surfaces along the second of the edge of the substrate.

According to one embodiment of the memory assembly, the second slot connector is connected to a printed circuit board with a flexible connector.

According to one embodiment of the memory assembly, the socket assembly further includes a housing that forms a receptacle slot for the memory module between the housing and a printed circuit board to which the socket assembly is mounted.

These and further features will be apparent with reference to the following description and attached drawings. In the description and drawings, particular embodiments have been disclosed in detail as being indicative of some of the ways in which the principles of the invention may be embodied, but it is understood that the invention is not limited correspondingly in scope. Rather, the invention includes all changes, modifications and equivalents coming within the scope of the claims appended hereto.

BRIEF DESCRIPTION OF THE DRAWINGS

The appended figures are not necessarily to scale.

DETAILED DESCRIPTION OF EMBODIMENTS

Embodiments will now be described with reference to the drawings, which are not necessarily to scale and wherein like reference numerals are used to refer to like elements throughout. Features that are described and/or illustrated with respect to one embodiment may be used in the same way or in a similar way in one or more other embodiments and/or in combination with or instead of the features of the other embodiments.

Described below in conjunction with the appended figures are various embodiments of a memory module and a corresponding socket assembly that are part of an electronic device. In the illustrated embodiments, the electronic device is embodied as a mobile telephone (e.g., a smart phone). It will be appreciated that the disclosed memory modules and socket assemblies may be used in other operational contexts. Examples of other devices that may be configured in the disclosed manner include, but are not limited to, a camera, a navigation device (commonly referred to as a "GPS" or "GPS device"), a personal digital assistant (PDA), a media player (e.g., an MP3 player), a gaming device, and a computing device, and especially those computing devices with a highly portable form factor such as an "ultra-mobile PC" or a "tablet" computer.

Figure 1:
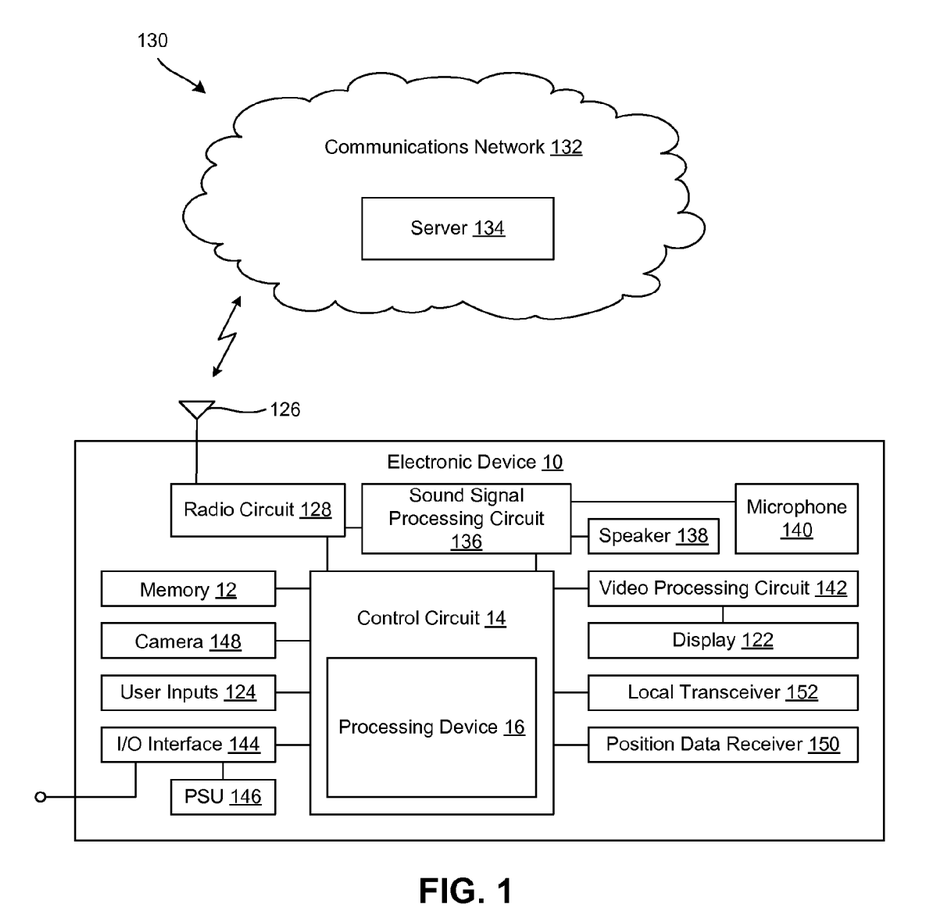
FIG. 1 is a schematic block diagram of an exemplary electronic device that includes a memory module.

Referring initially to FIG. 1, an electronic device 10 is shown. The illustrated electronic device 10 is a mobile telephone. The electronic device 10 includes a memory module 12. The memory module 12 may be used, for example, as RAM. RAM is sometimes referred to as system memory. In other embodiments, the memory module 12 may be used for non-volatile data storage (e.g., a flash memory) or as a combination of RAM and non-volatile memory. Other memory devices may be present, such as one or more of a buffer, a flash memory, a hard drive or other magnetic media, an optical memory (e.g., a compact disk (CD) or a digital versatile disk (DVD)), a removable media, or other suitable memory device.

The electronic device 10 may include a primary control circuit 14 that is configured to carry out overall control of the functions and operations of the electronic device 10. The control circuit 14 may include a processing device 16, such as a central processing unit (CPU), a microcontroller, or a microprocessor. In one embodiment, the processing device 16 executes code using the memory module 12 as system memory. The memory module 12 may exchange data with the control circuit 14 over a data bus. Accompanying control lines and an address bus between the memory module 12 and the control circuit 14 also may be present.

Figure 2:
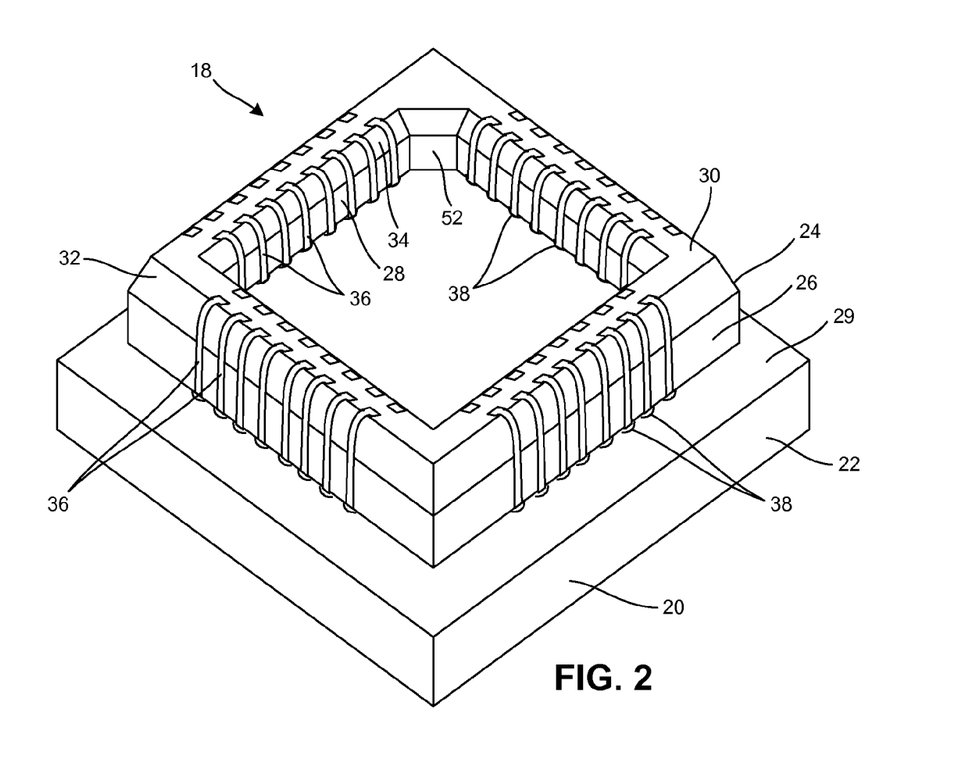
FIG. 2 is a perspective view of a socket for a memory module according to a first exemplary embodiment.

With additional reference to FIG. 2, shown is a socket assembly 18 for a first exemplary embodiment of the memory module 12. The socket assembly 18 includes a housing 20 that is made from molded plastic, for example. The housing 20 includes a base portion 22 and a connector portion 24 that extends from the base portion 22. In the illustrated embodiment, the connector portion 24 is generally square, but could be other shapes such as a rectangle. The connector portion 24 has a hollow center and the connector portion 24 has an outer wall 26 that is perpendicular to an upper surface 29 of the base portion 22, an inner wall 28 that is perpendicular to the upper surface 29, and an upper surface 30 that is parallel to the upper surface 29. The junction of the upper surface 30 respectively with the outer wall 26 and the inner wall 28 may be beveled to form an outer bevel 32 and an inner bevel 34, as illustrated. Alternatively, the junction may be curved or may be a ninety degree angle.

Connector pins 36 (also referred to as contacts) are present adjacent the inner wall 28 and the outer wall 26. The connector pins 36 may be strips of conductive metal. In the illustrated embodiment, there are eight connector pins 36 on each of the inner wall 28 and the outer wall 26 for each side of the connector portion 24. It will be appreciated that there may be more than or less than eight connector pins 36 at each of these locations, and that each of these locations need not have the same number of connector pins 36 (e.g., each side could have a different number of connector pins 36). Also, connector pins 36 may be located on some of sides of the connector portion 24. In the illustrated embodiment, the connector pins 36 at the outer wall 26 are aligned with connector pins 36 at the inner wall 28. In other embodiments, the connector pins 36 at the outer wall 26 are not aligned with connector pins 36 at the inner wall 28. The connector pins 36 along each segment (e.g., side) of the walls 26, 28 may be arranged with a pitch, such as about 0.3 millimeters (mm) to about 0.5 mm. In one embodiment, up to 240 connector pins 36 are present, depending on the pitch of the connector pins 36, and the size and shape of the connector portion 24.

The connector pins 36 may extend through corresponding holes 38 in the base portion 22, extend along the corresponding inner wall 28 or outer wall 26, extend along the corresponding inner bevel 34 or outer bevel 32, and attach to the upper surface 30. Attachment to the upper surface may be made with a pin (not illustrated) that extends through the connector pin 36 and into the connector portion 24, with adhesive, or with a portion of the connector pin 36 that is embedded in the connector portion 24. Alternatively, the connector pin 36 is not secured to the upper surface 30. In one embodiment, the connector pins 36 bow (e.g., curve) outward from the corresponding inner wall 28 and inner bevel 34 or the corresponding outer wall 26 and outer bevel 32. The bowing may be configured to facilitate electrical contact with mating contacts (discussed below) of the memory module 12. The connector pins 36 may be resiliently flexible (e.g., deformable, but may return toward its original shape in the absence of a deforming force). This may serve one or more functions, including providing a spring force against the memory device 12 to retain the memory module 12 in engagement with the socket assembly 18 and increasing the electrical connection between the connector pins 36 and the mating contacts of the memory module 12. In one embodiment, the connector pins 36, when viewed from the side, form half of a curved arch that, as it extends upward, is wider at the top than at the bottom.

Figure 3:
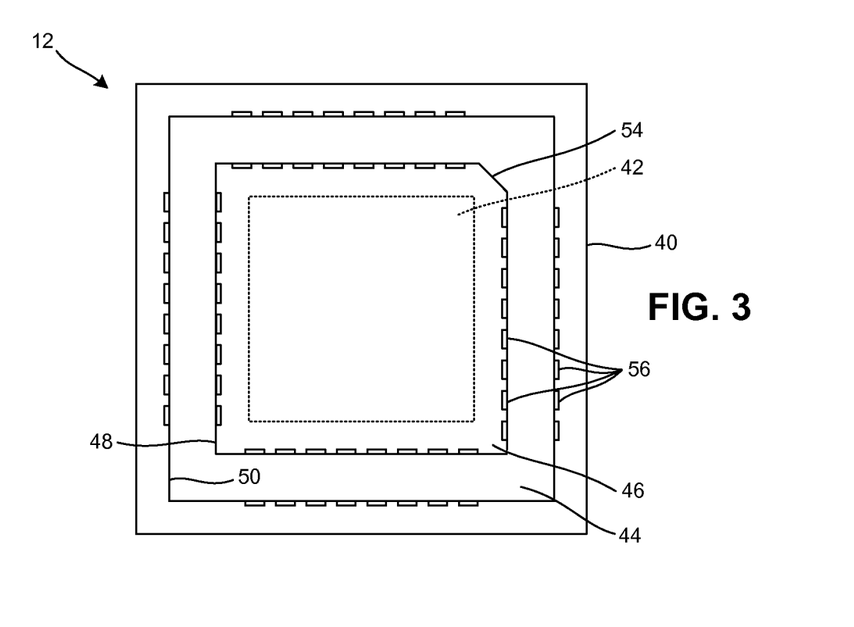
FIG. 3 is bottom view of the memory module according to the first exemplary embodiment.
Figure 4:
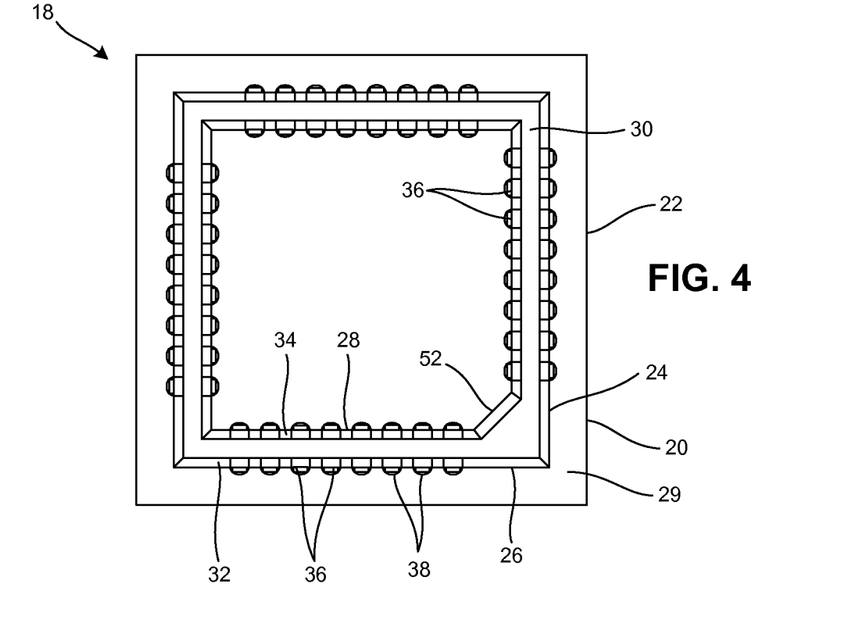
FIG. 4 is a top view of the socket of FIG. 2.

With additional reference to FIGS. 3 and 4, a bottom view of the memory module 12 of the first exemplary embodiment and a top view of the corresponding socket assembly 18 are respectively illustrated. The memory module 12 has a module body 40 that retains a memory core 42. The module body 40 may be made from plastic or may be some other carrier for the memory core 42. The memory core 42 is an integrated circuit containing logic elements and memory cells to implement the RAM. In one embodiment, the memory core 42 is a synchronous dynamic RAM (SDRAM). In the illustrated embodiment, the memory core 42 is embedded within the module body 40. In other embodiments, the memory core 42 is mounted on the upper surface of the module body 40. A length and width of the memory module 12 generally form a square (or some other shape, such as a rectangle) and the memory module 12 has a thickness. In one embodiment, the memory core 42 has a length and width of about 12 mm by about 12 mm, or smaller, and the module body 40 has a length and width of about 12 mm by about 12 mm to about 16 mm by about 16 mm, or smaller.

The module body 40 includes a channel 44 in a bottom surface 46 of the module body 40. The channel 44 is cooperatively shaped with the connector portion 24 of the socket assembly 18. In this manner, the connector portion 24 may be received in the channel 44 by placing the memory module 12 over the socket assembly 18, aligning the channel 44 with the connector portion 24 and moving the bottom surface 46 toward the upper surface 29. The channel 44 includes an inner wall 48 corresponding to the inner wall 28 of the connecting portion 24 and an outer wall 50 corresponding to the outer wall 26 of the connecting portion 24.

In one embodiment, the connector portion 24 and the channel 44 are keyed or shaped so that the memory module 12 will engage the socket assembly 18 in only one orientation. In the illustrated embodiment, the keying function is achieved using a flat 52 between two adjacent inner wall 28 sections of the connector portion 24 and a corresponding flat 54 between two adjacent inner wall 48 sections of the channel 44.

The memory module 12 includes connector pins 56 (also referred to as contacts) at the inner wall 48 and at the outer wall 50. The connector pins 56 establish electrical connection between the memory core 42 and circuitry external to the memory module 12 via the socket assembly 18. Electrical connection between the connector pins 56 and the memory core 42 is not illustrated, but may take place in any suitable manner including the use of conductive traces, wire bonds, etc.

The connector pins 56 may be flush with the walls 48 and 50, as illustrated, or raised from the surface of the walls 48, 50. The connector pins 56 may be made from conductive metal. In one embodiment, the connector pins 56 are arranged to have a one-to-one correspondence with the connector pins 36 of the socket assembly 18. In the one embodiment, the connector pins 56 along each wall 48, 50 segment may be arranged with a pitch, such as about 0.3 millimeters (mm) to about 0.5 mm. In the illustrated embodiment, there are eight connector pins 56 on each of the inner wall 48 and the outer wall 50 for each side of the channel 44. It will be appreciated that there may be more than or less than eight connector pins 56 at each of these locations, and that each of these locations need not have the same number of connector pins 56. In the illustrated embodiment, the connector pins 56 at the outer wall 50 are aligned with connector pins 56 at the inner wall 48. In other embodiments, the connector pins 56 at the outer wall 50 are not aligned with connector pins 56 at the inner wall 48. In one exemplary embodiment, up to 240 connector pins 56 are present, depending on the pitch of the connector pins 56, and the size and shape of the channel 44. A different number of connector pins 56 may be present. Also, connector pins 56 may be located on the flat 54 to mate with corresponding connector pins 36 on the flat 52.

Figure 5:
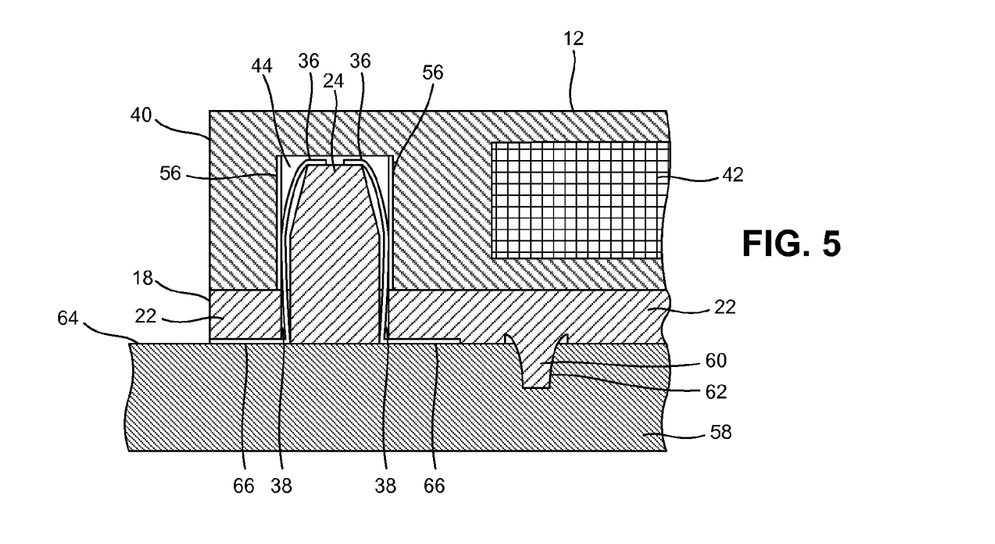
FIG. 5 is a partial cross-section of the socket of FIG. 2 when mounted to a PCB and retaining the memory module of FIG. 3.

With additional reference to FIG. 5, illustrated is a partial cross-section of the socket assembly 18, the memory module 12 when engaged with the socket assembly 18, and a PCB 58 on which the socket assembly 18 is mounted. In one embodiment, the housing 20 includes a steering pin 60 that is received in a corresponding hole 62 in the PCB 58 to ensure accurate assembly of the socket assembly 18 with the PCB 58. It will be recognized that the steering pin 60 and the corresponding hole 62 may be omitted.

As indicated, the connector pins 56 of the memory module 12 align with and electrically contact the connector pins 36 of the socket assembly 18. In one embodiment, the connector pins 56 apply force to the connector pins 36 to slightly deform the pins 36, thereby improving electrical contact. Also, the counter-force from the connector pins 36 may function to retain the memory module 12 in engagement with the socket assembly 18. In another embodiment, the connector pins 56 are resiliently deformable, in which case the pins 36 also may be resiliently deformable or may be substantially inflexible. In other embodiments, a mechanical latching mechanism (not illustrated) may assist in retaining the memory module 12 in engagement with the socket assembly 18.

The connector pins 36 may extend through the corresponding holes 38 to the PCB 58. In one embodiment, the connector pins 36 turn parallel to an upper surface of the PCB 64 and are connected to the PCB 58 by soldering at solder points 66 between the connector pins 36 and pads (not illustrated) on the PCB 58.

With reference to FIGS. 6-9, illustrated is a second exemplary embodiment of the memory module 12 and corresponding socket assembly 18. Similar to the first exemplary embodiment, the a length and width of the memory module 12 generally form a square (or some other shape, such as a rectangle) and the memory module 12 has a thickness. In the illustrated embodiment, the memory core 42 is embedded within the module body 40. In other embodiments, the memory core 42 is mounted on the upper surface of the module body 40. In one embodiment, the memory core 42 has a length and width of about 12 mm by about 12 mm, or smaller, and the module body 40 has a length and width of about 12 mm by about 12 mm to about 16 mm by about 16 mm, or smaller.

Figure 7:
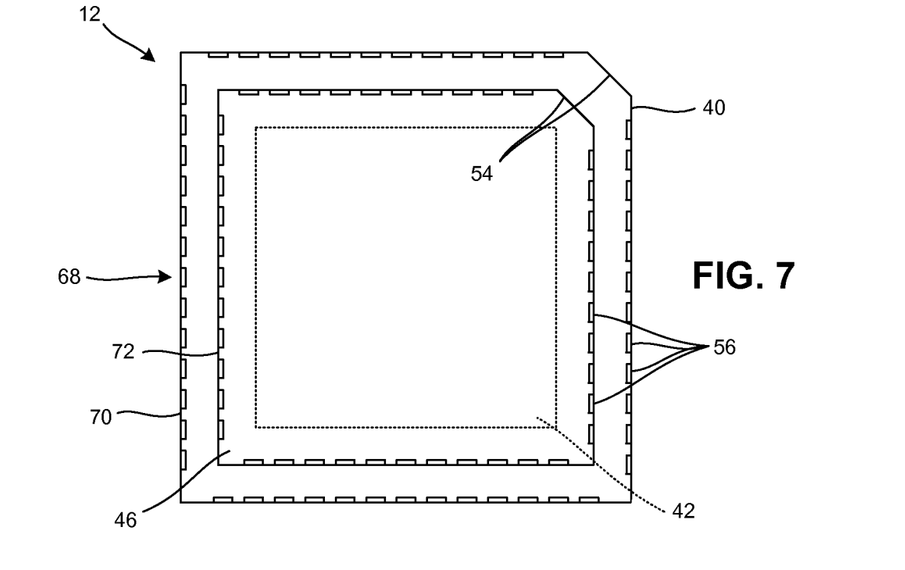
FIG. 7 is bottom view of the memory module according to the second exemplary embodiment.

The module body 40 has a tiered outer edge 68 so that the outer edge 68 has a first (or outer) wall portion 70 that is located outward from a second (or inner) wall portion 72. For each side of the memory module 12, the first and second wall portions 70, 72 each have wall sections that are parallel to one another, but offset with a radial component by about 1 mm to about 5 mm. Two adjacent segments (e.g., sides) of each wall portion 70, 72 join in a flat 54 for proper orientation of the memory module 12 with the socket assembly 18.

Connector pins 56 are located on each of the first wall portion 70 and the second wall portion 72. The connector pins 56 may be flush with the first wall portion 70 and the second wall portion 72, as illustrated, or raised from the surface of the wall portions 70, 72. In one embodiment, the connector pins 56 are arranged to have a one-to-one correspondence with the connector pins 36 of the socket assembly 18 (described below). In the one embodiment, the connector pins 56 along each segment (e.g., side) of the wall portions 70, 72 may be arranged with a pitch, such as about 0.3 millimeters (mm) to about 0.5 mm.

In the illustrated embodiment, the sides of the first wall portion 70 not terminating in the flat 54 each have 13 connector pins 56 and the sides of the first wall portion 70 terminating in the flat 54 each have 12 connector pins 56. Also, in the illustrated embodiment, the sides of the second wall portion 72 not terminating in the flat 54 each have 11 connector pins 56 and the sides of the second wall portion 72 terminating in the flat 54 each have 10 connector pins 56. In the illustrated embodiment, the connector pins 56 at the first wall portion 70 are aligned with the connector pins 56 at the second wall portion 72. In other embodiments, the connector pins 56 at the first wall portion 70 are not aligned with connector pins 56 at the second wall portion 72 (e.g., offset in the directions along the length and width of the memory module 12). In one exemplary embodiment, up to 240 connector pins 56 are present, depending on the pitch of the connector pins 56, and the size and shape of the first and second wall portions 70, 72. A different number of connector pins 56 may be present. Also, connector pins 56 may be located on the flats 54 to mate with corresponding connector pins 36 on the flats 52.

Figure 6:
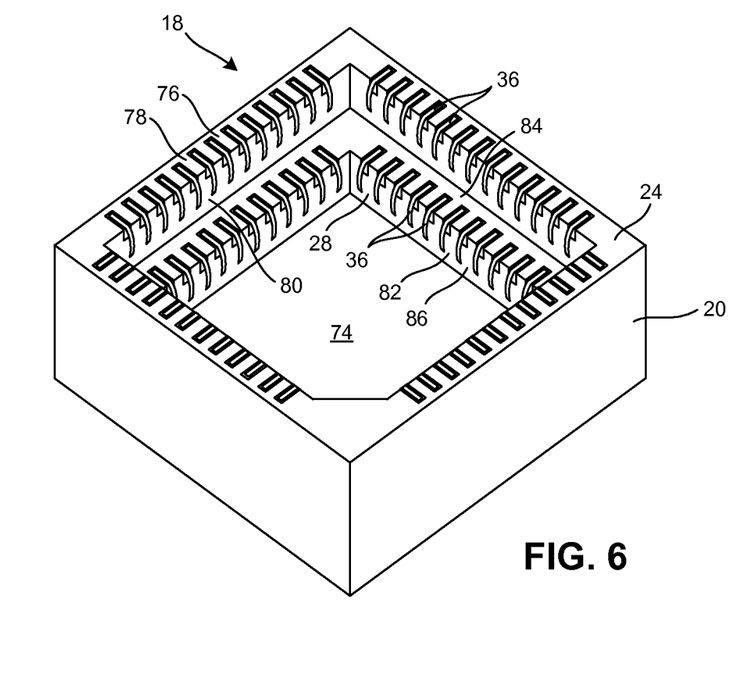
FIG. 6 is a perspective view of a socket for a memory module according to a second exemplary embodiment.
Figure 8:
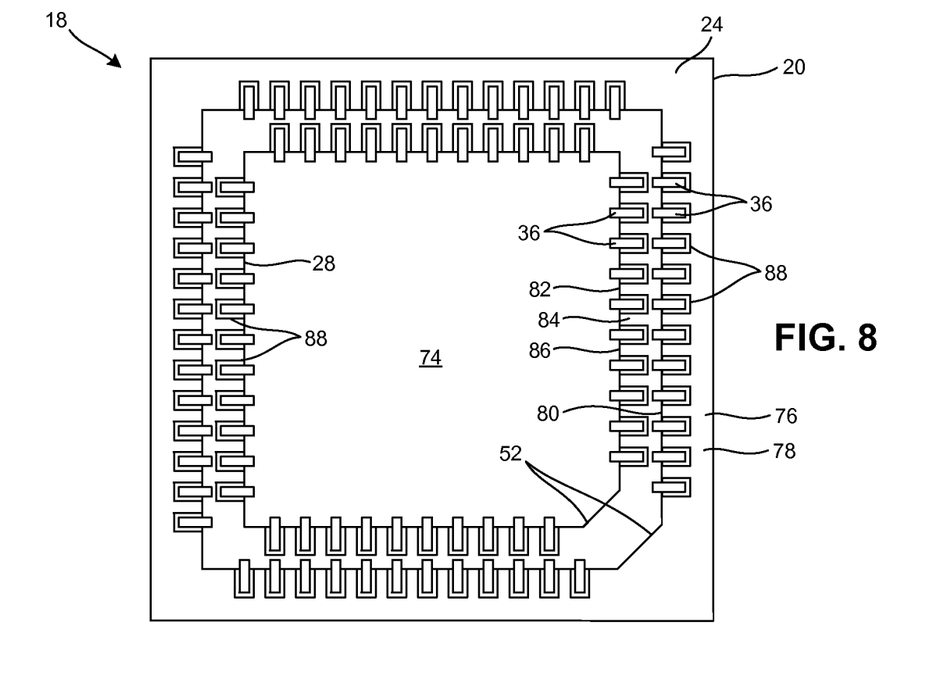
FIG. 8 is a top view of the socket of FIG. 6.

The socket 18 has a corresponding configuration. For instance, the housing 20 has a connector portion 24 that defines a cavity 74 that is sized and shaped to receive and inscribe the memory module 12. The connector portion 24 has a stepped inner wall 28 to form a first step 76 having an upper surface 78 and first inner wall portion 80 of the socket assembly 18 and second step 82 having an upper surface 84 and a second inner wall portion 86 of the socket assembly 18. The first inner wall portion 80 has connector pins 36 to make electrical contact with the connector pins 56 of the first wall portion 70 of the memory module 12 and the second inner wall portion 82 has connector pins 36 to make electrical contact with the connector pins 56 of the second wall portion 72 of the memory module 12. In one embodiment, the connector pins 56 of the memory module 12 are arranged to have a one-to-one correspondence with the connector pins 36 of the socket assembly 18.

In one embodiment, the socket assembly 18 and the memory module 12 are keyed or shaped so that the memory module 12 will engage the socket assembly 18 in only one orientation. In the illustrated embodiment, the keying function is achieved using flats 52 respectively between two adjacent sections (e.g., sides) of the first inner wall 80 and between two adjacent sections of the second inner wall 86 and the corresponding flats 54 of the memory module 12.

Figure 9:
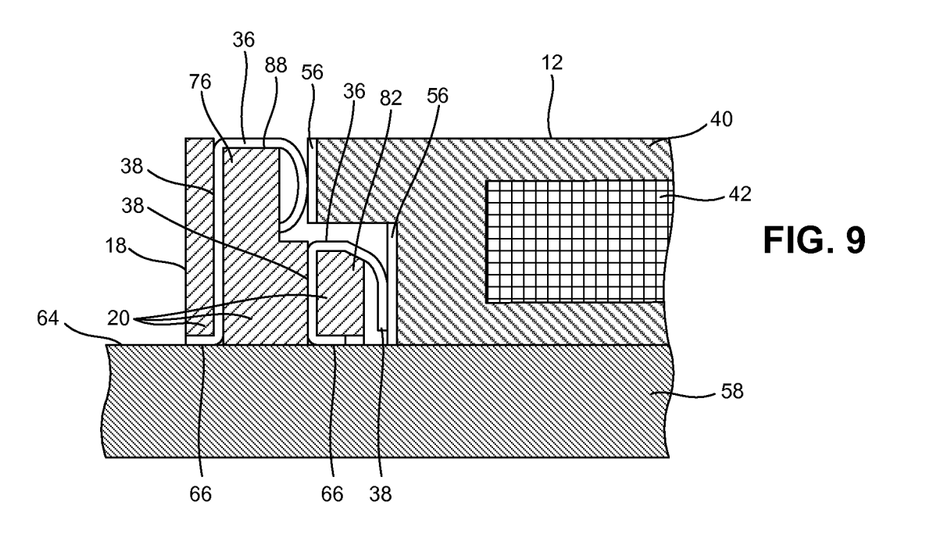
FIG. 9 is a partial cross-section of the socket of FIG. 6 when mounted to a PCB and retaining the memory module of FIG. 7.

In the illustrated embodiment, each connector pin 36 of the first step 76 starts parallel to the upper surface 64 of the PCB 58 where it connects to a corresponding pad (not shown) of the PCB 58 by soldering at a solder point 66. The connector pin 36 then turns upward and extends through a respective hole 38 in the connection portion 24 and exits into a respective recess 88 in the upper surface 78. The connector pin 36 then turns inward and travels through the recess 88 toward the first inner wall portion 80, at which the connector pin 36 turns downward and extends adjacent the first inner wall portion 80. The section of the connector pin 36 that extends adjacent the first inner wall portion 80 forms a connection area for a respective connector pin 56 of the first outer wall 70 of the memory module 12. Also, this section of the connector pin 36 may bow (e.g., curve) outward from the first inner wall portion 80. The bowing may be configured to facilitate electrical contact with the respective connector pin 56 of the memory module 12. The connector pin 36 may be resiliently flexible (e.g., deformable, but may return toward its original shape in the absence of a deforming force). This may serve one or more functions when forced outward by the respective connector pin 56 of the memory module 12, including providing a spring force against the memory device 12 to retain the memory module 12 in engagement with the socket assembly 18 and increasing the electrical connection between the connector pin 36 and the connector pin 56 of the memory module 12.

In the illustrated embodiment, each connector pin 36 of the second step 82 has a similar configuration. For example, the connector pin 36 starts parallel to the upper surface 64 of the PCB 58 where it connects to a corresponding pad (not shown) of the PCB 58 by soldering at a solder point 66. The connector pin 36 then turns upward and extends through a respective hole 38 in the connection portion 24 and exits into a respective recess 88 in the upper surface 84. The connector pin 36 then turns inward and travels through the recess 88 toward the second inner wall portion 86, at which the connector pin 36 turns downward and extends adjacent the second inner wall portion 86. The section of the connector pin 36 that extends adjacent the second inner wall portion 86 forms a connection area for a respective connector pin 56 of the second outer wall 72 of the memory module 12. Also, this section of the connector pin 36 may bow (e.g., curve) outward from the second inner wall portion 86. The bowing may be configured to facilitate electrical contact with the respective connector pin 56 of the memory module 12. The connector pin 36 may be resiliently flexible (e.g., deformable, but may return toward its original shape in the absence of a deforming force). This may serve one or more functions when forced outward by the respective connector pin 56 of the memory module 12, including providing a spring force against the memory device 12 to retain the memory module 12 in engagement with the socket assembly 18 and increasing the electrical connection between the connector pin 36 and the connector pin 56 of the memory module 12. In another embodiment, the connector pins 56 are resiliently deformable, in which case the pins 36 also may be resiliently deformable or may be substantially inflexible.

Figures 10, 11:
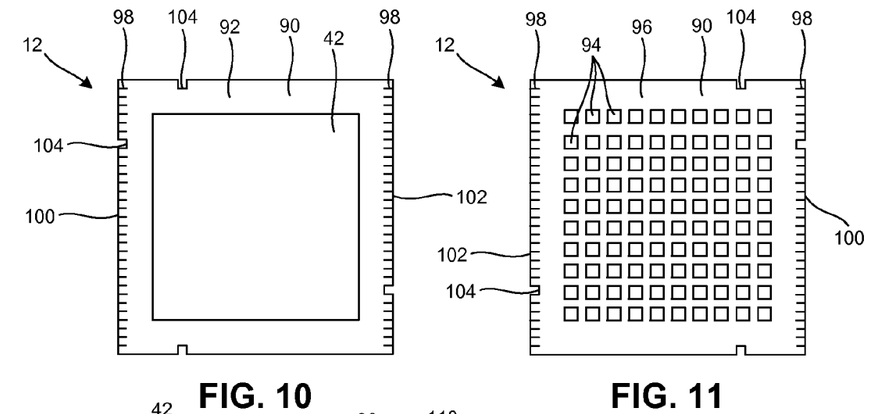
FIG. 10 is a top view of a memory module according to a third exemplary embodiment.
FIG. 11 is a bottom view of the memory module of FIG. 10.
Figure 12:
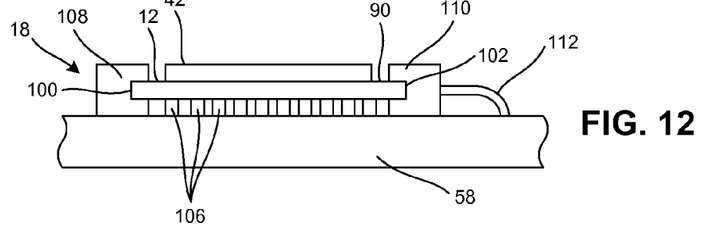
FIG. 12 is a side view of the memory module of FIG. 10 when mounted to a cooperating socket assembly that is, in turn, mounted to a PCB.

Turning now to FIGS. 10-12, illustrated is a third embodiment of the memory module 12 and a corresponding socket assembly 18. In this embodiment, the memory module 12 includes a substrate 90, such as a PCB. The memory core 42 is mounted to an upper surface 92 of the substrate 90. In one embodiment, the memory core 42 has a length and width of about 12 mm by about 12 mm, or smaller, and the substrate 90 has a length and width of about 16 mm by about 16 mm, or smaller.

The substrate 90 includes two connector types for electrically connecting the memory core 42 to circuitry external to the memory module 12. The first connector type includes contact pads 94 located on a lower surface 96 of the substrate 90 opposite the memory core 42. In the illustrated embodiment, there is a ten by ten matrix of contact pads 94 resulting in 100 contact pads 94. In one embodiment, the contact pads 94 are squares that are about 0.8 mm by 0.8 mm and with a 0.5 mm space between adjacent pads.

The second connector type includes contacts 98 on the upper surface 92 of the substrate 90 and along an edge 100 of the substrate and contacts 98 on the lower surface 96 of the substrate 90 and along the edge 100. The contacts 98 are illustrated schematically with short lines, but it will be appreciated that the contacts 98 have a width and length. Contacts 98 also may be present on the upper and lower surfaces 92, 96 of the substrate 90 and along a second edge 102 of the substrate 90. In the illustrated embodiment, the first and second edges 100, 102 oppose one another. In another embodiment, the edges 100, 102 may be adjacent one another. In still other embodiments, contacts 98 may be positioned along three or four edges of the substrate 90. The edges may include notches 104 or other keying mechanism for proper insertion of the memory module 12 into a socket assembly 18.

In one embodiment, each edge 100, 102 has 32 contacts 98 located on the upper surface 92 and another 32 contacts located on the lower surface 96 for a total of 64 contacts 98 per edge 100, 102. Therefore, between the edges 100 and 102, the memory module 12 has 128 contact 98. In the exemplary embodiment, the memory module 12 has 228 contacts, inclusive of the 100 contact pads 94 and the 128 contacts 98.

The socket assembly 18 for the memory module 12 of the third embodiment may be a collection of components mounted to the PCB 58. The components may include spring connectors 106 for making electrical connection to the contact pads 94. The components also may include a grip or slot connector 108 for receiving the first edge 100 and having contacts to connect to the contacts 98 adjacent the first edge 100. The connector 108 is securely mounted to the PCB 58. The components also may include a second grip or slot connector 110 for receiving the second edge 102 and having contacts to connect to the contacts 98 adjacent the second edge 102. In one embodiment, the second connector 110 is not securely mounted to the PCB 58. Instead, the connector 110 is connected to the PCB 58 with a flex film 112 having electrical traces.

Mounting of the memory module 12 to the socket assembly 18 may include pressing the first edge 100 into the connector 108, which also brings the spring connectors 106 into contact with the contact pads 94. The connector 110 then may be connected to the second edge 102 of the substrate 90.

Figure 13:
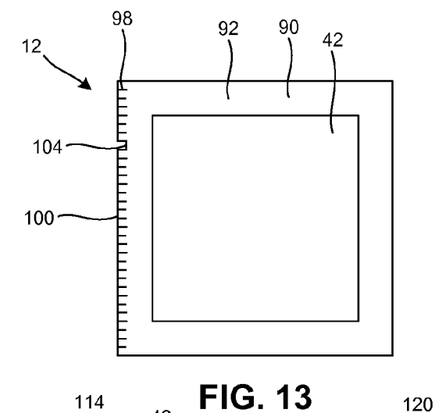
FIG. 13 is a top view of a memory module according to a fourth exemplary embodiment.
Figure 14:
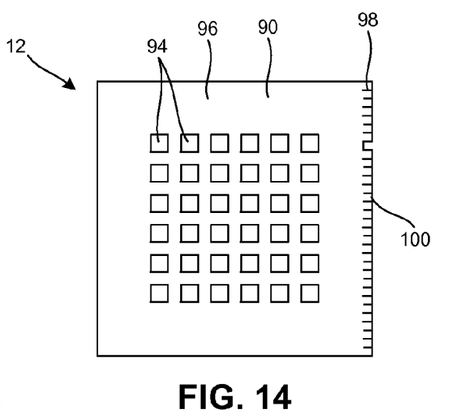
FIG. 14 is a bottom view of the memory module of FIG. 13.
Figure 15:
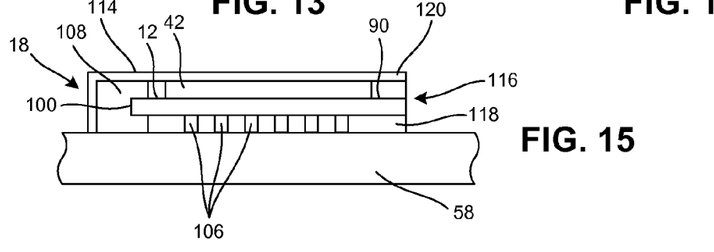
FIG. 15 is a side view of the memory module of FIG. 13 when mounted to a cooperating socket assembly that is, in turn, mounted to a PCB.

Turning now to FIGS. 13-15, illustrated is a fourth embodiment of the memory module 12 and a corresponding socket assembly 18. In this embodiment, the memory module 12 includes a substrate 90, such as a PCB. The memory core 42 is mounted to an upper surface 92 of the substrate 90. In one embodiment, the memory core 42 has a length and width of about 12 mm by about 12 mm, or smaller, and the substrate 90 has a length and width of about 16 mm by about 16 mm, or smaller.

The substrate 90 includes two connector types for electrically connecting the memory core 42 to circuitry external to the memory module 12. The first connector type includes contact pads 94 located on a lower surface 96 of the substrate 90 opposite the memory core 42. In the illustrated embodiment, there is a six by six matrix of contact pads 94 resulting in 36 contact pads 94. In one embodiment, the contact pads 94 are squares that are about 1 mm by 1 mm and with a 1 mm space between adjacent pads.

The second connector type includes contacts 98 on the upper surface 92 of the substrate 90 and along an edge 100 of the substrate and contacts 98 on the lower surface 96 of the substrate 90 and along the edge 100. The contacts 98 are illustrated schematically with short lines, but it will be appreciated that the contacts 98 have a width and length. In the illustrated embodiment, the contacts 98 are located only along the edge 100, but in other embodiments contacts 98 may be located along other edges. One or more notches 104 or other keying mechanism may be present for proper insertion of the memory module 12 into a socket assembly 18.

In one embodiment, the edge 100 has 32 contacts 98 located on the upper surface 92 and another 32 contacts located on the lower surface 96 for a total of 64 contacts 98. In the exemplary embodiment, the memory module 12 has 100 contacts, inclusive of the 36 contact pads 94 and the 64 contacts 98.

The socket assembly 18 for the memory module 12 of the third embodiment may be a collection of components mounted to the PCB 58. The components may include spring connectors 106 for making electrical connection to the contact pads 94. The components also may include a grip or slot connector 108 for receiving the edge 100 and having contacts to connect to the contacts 98 adjacent the first edge 100. The connector 108 is securely (e.g., inflexibly) mounted to the PCB 58. The socket assembly 18 also may include a housing 114 that forms a receptacle slot 116 into which the memory module 12 in inserted. The housing 114 may include one or more sidewalls 118. In the illustrated embodiment, a foreground sidewall of the housing 114 is shown removed to better illustrate the memory module 12 in the socket assembly 18. The housing 114 may also include a top wall 120. In one embodiment, the memory module 12 is urged against the top wall 120 by the spring connectors 106.

Mounting of the memory module 12 to the socket assembly 18 may include sliding the memory module 12 into the receptacle slot 116 and engaging the edge 100 into the connector 108, which also brings the spring connections 106 into contact with the contact pads 94.

The third and fourth embodiments result in a memory module 12 similar to a DIMM, but the third and fourth embodiments may be shorter than a DIMM of an equivalent amount memory capacity due to by use of contacts along one or more edges and on a lower surface of the memory module 12.

Each of the disclosed embodiments results in a memory module 12 that may be readily removed from an electronic device 10. In this manner, a faulty memory module 12 may be replaced or the memory capacity of the electronic device 10 may be increased by replacing a lower capacity memory module 12. Also, for developers of electronic devices 10, the changeability of the memory module 12 allows a greater degree of freedom to change the RAM configuration during the development process, including during late stages of the development process. Additionally, the changeability of the memory module 12 may provide a greater number of configuration options to a consumer of the electronic device 10.

With continued reference to FIG. 1, the electronic device 10 may include various other components. In the exemplary embodiment of a mobile telephone, the electronic device 10 may include a display 122 for displaying visual content to a user. One or more user input devices 124 may be present. User input devices 124 may include, for example, buttons, a keypad, a touch screen, a pointer, etc.

In addition, the electronic device 10 may include communications circuitry that enables the electronic device 10 to establish communication with another device. Communications may include voice calls, video calls, data transfers, and the like. Communications may occur over a cellular circuit-switched network or over a packet-switched network (e.g., a network compatible with IEEE 802.11, which is commonly referred to as WiFi, or a network compatible with IEEE 802.16, which is commonly referred to as WiMAX). Data transfers may include, but are not limited to, receiving streaming content, receiving data feeds, downloading and/or uploading data (including Internet content), receiving or sending messages (e.g., text messages, instant messages, electronic mail messages, multimedia messages), and so forth. This data may be processed by the electronic device 10, including storing the data in memory, executing applications to allow user interaction with the data, displaying video and/or image content associated with the data, outputting audio sounds associated with the data, and so forth.

In the exemplary embodiment, the communications circuitry may include an antenna 126 coupled to a radio circuit 128. The radio circuit 128 includes a radio frequency transmitter and receiver for transmitting and receiving signals via the antenna 126. The radio circuit 128 may be configured to operate in a mobile communications system 130. Radio circuit 128 types for interaction with a mobile radio network include, but are not limited to, global system for mobile communications (GSM), code division multiple access (CDMA), wideband CDMA (WCDMA), general packet radio service (GPRS), WiFi, WiMAX, integrated services digital broadcasting (ISDB), high speed packet access (HSPA), etc., as well as advanced versions of these standards or any other appropriate standard. It will be appreciated that the electronic device 10 may be capable of communicating using more than one standard. Therefore, the antenna 126 and the radio circuit 128 may represent one or more than one radio transceiver.

The system 130 may include a communications network 132 having a server 134 (or servers) for managing calls placed by and destined to the electronic device 10, transmitting data to and receiving data from the electronic device 10, and carrying out any other support functions. The communications network 132 may includes transmission mediums through which wireless communications with the electronic device 10 are established. The transmission mediums may be any appropriate device or assembly, including, for example, a communications base station (e.g., a cellular service tower, or "cell" tower), a wireless access point, a satellite, etc. The network 132 may support the communications activity of multiple electronic devices 10 and other types of end user devices. As will be appreciated, the server 134 may be configured as a typical computer system used to carry out server functions and may include a processor configured to execute software containing logical instructions that embody the functions of the server 134 and a memory to store such software. In alternative arrangements, the electronic device 10 may wirelessly communicate directly with another electronic device (e.g., another mobile telephone or a computer) and without an intervening network.

The electronic device 10 further includes a sound signal processing circuit 136 for processing audio signals. Coupled to the sound processing circuit 136 are a speaker 138 and a microphone 140 that enable a user to listen and speak via the electronic device 10, and hear sounds generated in connection with other functions of the device 10. The sound processing circuit 136 may include any appropriate buffers, encoders, decoders, amplifiers and so forth.

The display 122 may be coupled to the control circuit 14 by a video processing circuit 142 that converts video data to a video signal used to drive the display 122. The video processing circuit 142 may include any appropriate buffers, decoders, video data processors and so forth.

The electronic device 10 may further include one or more input/output (I/O) interface(s) 144. The I/O interface(s) 144 may be in the form of typical mobile telephone I/O interfaces and may include one or more electrical connectors for operatively connecting the electronic device 10 to another device (e.g., a computer) or an accessory (e.g., a personal handsfree (PHF) device) via a cable. Further, operating power may be received over the I/O interface(s) 144 and power to charge a battery of a power supply unit (PSU) 146 within the electronic device 10 may be received over the I/O interface(s) 144. The PSU 146 may supply power to operate the electronic device 10 in the absence of an external power source.

The electronic device 10 also may include various other components. For instance, a camera 148 may be present for taking digital pictures and/or movies. A position data receiver 150, such as a global positioning system (GPS) receiver, may be involved in determining the location of the electronic device 10. A local transceiver 152, such as a short-range RF transceiver (e.g., a Bluetooth chipset) may be used to establish communication with a nearby device, such as an accessory (e.g., a PHF device), another mobile radio terminal, a computer or another device.

Although certain embodiments have been shown and described, it is understood that equivalents and modifications falling within the scope of the appended claims will occur to others who are skilled in the art upon the reading and understanding of this specification.

What is claimed is:

1. An electrical assembly, comprising:
 a printed circuit board retaining electrical circuitry;
 a memory module, including:
  a rectangular module body having a length in a length direction, a width in a width direction, and a thickness in a thickness direction, and the module body configured with two opposing sides in the length direction and two opposing sides in the width direction, the sides in the length direction separated by the sides in the width direction and the sides in the width direction separated by the sides in the length direction, each side comprising a first wall and a second wall, the walls parallel to the thickness direction, and wherein the length direction, the width direction and the thickness direction are mutually orthogonal;
  a random access memory (RAM) memory core retained by the module body; and
  for each side of the module body:
   a first plurality of contacts disposed at the first wall; and
   a second plurality of contacts disposed at the second wall, electrical connection between the memory core and the electrical circuitry made through the first and second plurality of contacts, the electrical circuitry external to the memory module; and
 a socket assembly corresponding to the memory module and mounted to the printed circuit board, the socket assembly interposed between the memory module and the printed circuit board, the socket assembly including:
  a connector portion shaped in coordination with the memory module into which the module body is received and retained; and
  for each side of the module body:
   a first plurality of connector pins disposed adjacent the connector portion, each of the first plurality of connector pins in alignment and electrical contact with a respective one of the first plurality of contacts of the memory module; and
   a second plurality of connector pins disposed adjacent the connector portion, each of the second plurality of connector pins in alignment and electrical contact with a respective one of the second plurality of contacts of the memory module, electrical connection between the memory core and the electrical circuitry made through the first and second plurality of connector pins.

2. The electrical assembly of claim 1 wherein the module body includes a key mechanism configured to align the memory module with the corresponding socket assembly in a single orientation.

3. The electrical assembly of claim 1 wherein the memory core is embedded within the module body.

4. The electrical assembly of claim 1 wherein the first and second walls of the module body are sidewalls of a channel in the module body and wherein the connector portion of the corresponding socket assembly is shaped to fit in the channel.

5. The electrical assembly of claim 1, wherein the connector pins of the corresponding socket assembly are resilient and deformed by the memory module, counterforce on the memory module by the connector pins at least one of increasing electrical contact between the contacts of the memory module and the connector pins of the socket assembly or retaining the memory module in engagement with the socket assembly.

6. The electrical assembly of claim 1, wherein the thickness of the memory module is less than each of the width of the memory module and the length of the memory module.

7. The electrical assembly of claim 1, wherein the corresponding socket assembly is securely mounted to the printed circuit board and wherein the memory module is detachably received by the corresponding socket.

8. The electrical assembly of claim 7, wherein the printed circuit board is parallel to the length and width of the memory module.

* * * * *